United States Patent [19]

Elabd et al.

[11] Patent Number: 4,663,656
[45] Date of Patent: May 5, 1987

[54] HIGH-RESOLUTION CCD IMAGERS USING AREA-ARRAY CCD'S FOR SENSING SPECTRAL COMPONENTS OF AN OPTICAL LINE IMAGE

[75] Inventors: Hammam Elabd, East Windsor Township, Mercer County; Walter F. Kosonocky, Montgomery Township, Somerset County, both of N.J.

[73] Assignee: RCA Corporation, Princeton, N.J.

[21] Appl. No.: 590,888

[22] Filed: Mar. 16, 1984

[51] Int. Cl.⁴ ............... G03F 3/08; H01L 29/78; H04N 5/335; H04N 9/07
[52] U.S. Cl. ........................ 358/75; 358/41; 358/44; 358/48; 358/54; 358/209; 358/294; 358/213.26; 358/213.29; 357/24
[58] Field of Search .............. 358/41, 43, 44, 48, 358/50, 52, 53, 54, 75, 78, 293, 213, 209, 294; 357/24, 24 LR

[56] References Cited

U.S. PATENT DOCUMENTS

| | | | |
|---|---|---|---|
| 3,814,846 | 6/1974 | Snow | 357/24 |
| 4,264,921 | 4/1981 | Pennington et al. | 358/50 |
| 4,432,022 | 2/1984 | Tokumitsu | 358/293 |
| 4,467,342 | 8/1984 | Tower | 357/24 LR |
| 4,498,013 | 2/1985 | Kuroda et al. | 250/578 |

FOREIGN PATENT DOCUMENTS

| | | | |
|---|---|---|---|
| 0043721 | 1/1982 | European Pat. Off. | 358/75 |
| 22316 | 3/1978 | Japan | 358/294 |
| 154348 | 12/1979 | Japan | 358/75 |
| 42379 | 3/1983 | Japan | 358/41 |
| 101566 | 6/1983 | Japan | 358/75 |
| 182365 | 10/1983 | Japan | 358/75 |
| 206280 | 12/1983 | Japan | 358/213 |

OTHER PUBLICATIONS

Parker, Sybil P., Editor in Chief, *McGraw-Hill Concise Encyclopedia of Science & Technology*, See "Electrometer", New York et al., date unknown.

Primary Examiner—James J. Groody
Assistant Examiner—Randall S. Svihla
Attorney, Agent, or Firm—Joseph S. Tripoli; Allen L. Limberg; Lawrence C. Edelman

[57] ABSTRACT

CCD imagers with a novel replicated-line-imager architecture are abutted to form an extended line sensor. The sensor is preceded by optics having a slit aperture and having an optical beam splitter or astigmatic lens for projecting multiple line images through an optical color-discriminating stripe filter to the CCD imagers. A very high resolution camera suitable for use in a satellite, for example, is thus provided. The replicated-line architecture of the imager comprises an area-array CCD, successive rows of which are illuminated by replications of the same line segment, as transmitted by respective color filter stripes. The charge packets formed by accumulation of photoresponsive charge in the area-array CCD are read out row by row. Each successive row of charge packets is then converted from parallel to serial format in a CCD line register and its amplitude sensed to generate a line of output signal.

18 Claims, 5 Drawing Figures

HIGH-RESOLUTION CCD IMAGERS USING AREA-ARRAY CCD'S FOR SENSING SPECTRAL COMPONENTS OF AN OPTICAL LINE IMAGE

The invention described herein was made in performance of work under NASA Contract No. NAS 5-27505 and is subject to the provisions of Section 305 of the National Aeronautics and Space Act of 1958 (72 Stat. 435; 42 U.S.C. 2457).

FIELD OF INVENTION

Our invention relates to CCD television cameras of the type incorporating a CCD line imager for line scanning and deriving transversal scanning of a field of view by optical displacement of the image field relative to the CCD line imager.

BACKGROUND OF THE INVENTION

Such a camera may use a mechanically scanned optical slit system. The particular application we concerned ourselves with is a camera to be used in a satellite orbiting a celestial body to be observed. The satellite camera has to provide as high resolution of image as feasible and has to have color-discriminating capability. Red (R), green (G), blue (B) and near infrared (NIR) responses to image are separated.

A CCD field imager, imaging an entire field at any time rather than just a slit or line in that field as a CCD line imager does, has to have an area array of photosensing sites. (In this document "photosensing site" refers to the location of a photosensing element, supposing photosensing not to be done within a CCD charge channel, or to the location at which charge carriers are collected in a CCD charge transfer channel, but supposing photosensing to be done in the semiconductive material in which the charge transfer channel is formed.) These sites are arranged in a field imager of field transfer type along each of parallelled charge transfer channels defining the columns of the array and are further arranged to be in rows. Each row is formed by the alignment of respective charge transfer stages in each charge transfer channel. So resolution in the direction transverse to line scan (and to rows of the array) is limited in a CCD field imager of field transfer type by the reciprocal of the minimum length of the charge transfer stage. A slight improvement is possible by staggering alternate charge transfer sites in the rows of the array. A problem is encountered in attempting to design a high-resolution field imager, as one seeks manyfold increase in the number of picture elements across the field in the direction transverse to line scan, particularly an increase beyond the number of minimum length charge transfer stages that will fit into each one of paralleled charge transfer channels extending across a semiconductor die of reasonable size. It appears to us to be difficult to extend column lengths in the array over adjoining semiconductor dies, while (as will be discussed later in this document) we were able to arrange for extending row lengths in a CCD imager by designing semiconductor dies that could be abutted with others of their like. Further, problems appear in the long-column arrays because of charge transport factor limitations. But, with transversal scanning being done by optical displacement of the image field relative to a line CCD imager, the minimum length of a charge transfer stage no longer imposes a limitation on resolution in the direction transverse to line scan. As we will reveal, this becomes important in arranging for color discrimination by the CCD imager.

Color discrimination properties have been provided many ways in the prior art to CCD field imagers, because of the interest in developing cameras for color television broadcasting or simpler color television cameras for home use. In broadcast cameras a color-discriminating optical beam splitter has been used to separate incoming radiation into spectral components for application to separate CCD field imagers. These imagers generate video signals responsive to the spectral components they respectively receive. This approach involves close optical registration of the photosensing sites on the various imagers to preserve image resolution, so it seemed best to us to avoid this approach in the high-resolution satellite camera.

CCD field imagers have also been used in conjunction with color-pattern optical filters, either of a contact type or of a type using relay optics. This practice of using color pattern filters with imaging devices arose during the development of single-tube color cameras, which used color-pattern optical filters to place stripes of differing colors on their targets in superposition with scan lines. The various color responses in electric signal from radiation received by the camera were subsequently sorted out by line selecting means following the camera tube. Color stripe filters with stripes parallel to line scan have not been used in CCD field imagers to our knowledge. In part this may be because the minimum length of charge transfer stages readily contructed on a semiconductor die of reasonable size, using current silicon-device design rules, just about fulfills the vertical resolution requirements of broadcast television standards, so the loss of vertical resolution incurred with a horizontal color stripe filter would complicate device design. A more important reason, perhaps, is to obtain superposed picture element samples for the various color responses one must resort to transversal low-pass spatial filtering involving the use of time delays of substantial length (i. e. of line scan time length). In any case, the color-pattern optical filters employed with CCD field imagers employ color patterns more complex than simple color stripes or employ color stripes in the direction transverse to line scan. The superposing of picture element samples in the various color responses by low-pass spatial filtering in the line scan direction, which is required with this latter type of color stripe filter, does not need long time delays.

If one attempts to perform patterned-color filtering with a line imager analogous to the filtering provided for one row of the CCD field imagers with patterned-color filters, the photosensing sites in the line imager receive radiation selectively spectrally filtered line segment by line segment. That is, the pattern of filtering corresponds to that provided by a color-stripe filter having stripes in the direction transverse to line scan. The color-pattern filtering, or color-stripe filtering transverse to direction of line scan, undesirably reduces the resolution of the imager in direction of line scan. Attempting to magnify the image optically before projecting it into a lengthened line imager, as a way of maintaining spatial resolution despite line image segmentation by the color filter, is unattractive to do. Even though buttable linear arrays on respective semiconductor dies can be used to accommodate lengthening of the line array, the increased capacitance associated with the gate electrodes of the line imager undesirably cuts down the speed with which charge samples can be moved in the imager and converted to output voltage samples.

We provide for color discrimination in our CCD line imager in a surprising way. We use an area array of photosensing sites—rather than a linear array—and we use a color-stripe filter with the color stripes running in the row direction of the CCD imager,—and in the direction of line scan, in the line imager output signal. In the direction transverse to line scan the line image passing through an optical slit filter is beam split or defocussed in the transverse direction, before passage through the color-stripe filter. That is, the same line image is replicated for application to each row of charge sensing sites in the area array, that application being made through respective stripes of the color-stripe filters. Each row of photosensing sites in the array receives a different spectral response stripe, but each different spectral response is to one of the replications of the same line image. An area array of rows of photosensing sites in which successive rows of the sites receive response to the same line image, rather than to successive line images in an area image, we term a "replicated line imager". Resolution in the direction of line scan is not compromised by such filtering.

The resolution in the transverse direction is determined by the optical slit filter, not by the imager, because we operate the area array as a replicated line imager. Scanning in the direction transverse to line scan still is accomplished by optical line selection. So we continue to avoid the limitation on resolution in this transverse direction imposed by the minimum length of a charge transfer stage in a field imager.

As noted above, the array of photosensing sites (i.e., the image, or A register) is arranged so the spectrally-filtered line images lie along the rows of the array, which are of extended length to provide high resolution in the direction of line scan. The columns of the array defined by the CCD charge transfer channels are short, facilitating the rapid transfer of line segment portions of the charge samples from the adjacent columns of the array into corresponding columns of a few-row field storage, or, B, register during relatively short transfer intervals between relatively long image integration times. After each transfer interval the charge samples can be advanced a row at a time in the field storage register with the row transferred out of the B register transferred in parallel into an output CCD line (or C) register for subsequent serial read-out to a charge sensing stage. This mode of operation is in many respects analogous to the field transfer method of charge sample extraction in field imagers first described by P. K. Weimer in U.S. Pat. No. 3,763,480 issued Oct. 2, 1973 and entitled "DIGITAL AND ANALOG DATA HANDLING DEVICES".

The very few rows and short columns in our replicated line imager area array make the charge sample extraction behave differently from a field imager with 1:1 or 3:4 height-to-width aspect ratio, where the Weimer charge sample extraction scheme is commonly employed. A single row advance transfers a number of charge samples in parallel that is a significantly larger fraction of the total number of charge samples transferred from the image register to the field storage register(s) in the field transfer interval. This permits a shorter field transfer interval relative to image integration interval, which reduces the need for interrupting the projection of image into the imager during field transfer in order to avoid transfer smear. Transfer smear is an unwanted source of crosstalk between the lines of charge samples that adversely affects the purity of the different color responses. Similarly, the time for transfer from the field storage register(s) to the output register(s) can be a substantially smaller fraction of the time between field transfer intervals. The proportion of time scan lines can be serially read out of the image output register(s) to the time they cannot is significantly higher than with a field imager, and this helps to keep the clocking rate of the output registers lower. Also the short columns of the image and field storage registers, despite the high resolution of the imager in the direction transverse to line scan, avoids the introduction of problems that would be associated with many signal charge transfers through those CCD registers.

Having solved the problem of providing high resolution in the direction transverse to line scan, the remaining problems with regard to a high-resolution CCD imager mostly concern obtaining the desired high resolution in the direction of line scan. The limitation on this resolution is imposed chiefly by the minimum length of the charge transfer stages in the output line (or C) register(s). Dividing this length (as determined by current silicon device design rules) into the distance between opposing parallel edges of a reasonable-size (by current standards) semiconductor die, we determined that the satellite camera would require a number of abutted such dies to obtain the number of picture elements per scan line required. The close abutting of photosensing elements on adjacent dies, required to maintain high resolution in the line scan direction, necessitate new layout techniques for situating the imager on the die.

Using abutted semiconductor dies with component line imagers, to provide a composite line image capable of sensing a longer line image at given resolution or of providing greater resolution for given line image length, means output registers on the dies need not operate at the high rate required of a single, long output register. That is, time-division-multiplexing of the output registers on the semiconductor dies can be eschewed in favor of spatial-multiplexing to cut the clocking rate required of the registers. In spatial multiplexing the imager output registers are read out in parallel at the same time.

Spatial-multiplexing can be carried further using a plurality of parallelly clocked output registers on the same semiconductor die for the component line imager. Then, too, the number of stages in each output (or C) register becomes of concern with regard to charge transfer efficiency being less than perfect and giving rise to transfer inefficiency noise. With the semiconductor die size we contemplated using, we decided that half the charge transfer channels used for transfer storage should be served by one output (or C) register; and the remaining half, by another output register.

Our initial concept of the layout of the replicated line imager on the semiconductor die, so abutting component line imagers to form a composite line imager would be facilitated was as follows. The rows of an image (or A) register would extend between the opposing edges of the die at least one of which would abut an adjoining die. The rows of a field storage (or B) register would also stretch between the edges, and its columns would continue from respective columns of the A register. The final charge transfer stages in the charge transfer channels making up the columns in a half of the B register closest to one edge of the die would connect by a fan-in structure to respective ones of the successive charge transfer stages in one of the two output (C) registers, and the other output register would have the final charge transfer stages in the other charge transfer channels of the B register connected to it analogously.

We conceived using a common electrometer, or charge sensing stage, centrally located between the opposing abuttable edges of the die, for both output registers, which output registers would be clocked for charge transfer in opposite directions towards the electrometer. The electrometer was to be a field effect transistor with gate connection to floating diffusions in each of the output registers. The central location of the electrometer would tend to keep elements away from the edges of the die that were adapted for abutting an adjoining die and reduce the amount of fan-in between the field storage register halves and their corresponding output registers. Using a common electrometer for the two output registers, rather than separate ones, we believed would avoid congestion in the central portion of the semiconductor die.

While this concept of using plural output registers which charge transfer away from the opposing abuttable edges and towards charge sensing circuitry well within the confines of the semiconductor die top-surface boundary was retained in our subsequent camera development, we found a number of practical problems with our initial lay-out conception that tended to adversely affect the fabrication yield of the imager dies. Using a common electrometer stage for the two output registers on each die involved 90° turns within 15 microns at the ends of those registers, which gave trouble. The busses carrying clocking signals to gate electrodes of the A and B registers had to cross the C registers, so avoiding clocking cross-talk was difficult. Bus routing problems were so severe that we could find no way to use anti-blooming drains, owing to the difficulty of making connections to the drains.

We found these problems could be avoided with a layout of the following type. The image (or A) register still extends from a first edge of the semiconductor die to a second opposing edge, but is divided into halves along a boundary midway between the first and second edges of the die. The A1 and A2 registers that are the respective halves of the A register are arranged for charge transfer in opposing directions to respective B1 and B2 field storage registers during charge transfer intervals. During subsequent image integration times when clocking is halted in the A1 and A2 registers, charge samples are clocked out of the B1 and B2 registers in the same directions as they were clocked in, being clocked in parallel into respective C1 and C2 output registers for conversion to serial format. Charge samples are serially clocked from the C1 and C2 registers towards the center of the die to be sensed in separate charge sensing circuits.

SUMMARY OF THE INVENTION

A primary aspect of the invention is a television camera using a replicated line imager architecture in a CCD imager, means for acquiring radiation defining a line image and a spectrum-discriminating striped optical filter system receptive of the line image for projecting selectively filtered response stripes to respective line imager portions of the CCD imager. Further aspects of the invention concerns replicated line imager architectures and line imager architectures which facilitate abutting of imager segments on adjoining semiconductor dies to obtain extended line imager length.

DETAILED DESCRIPTION OF THE PREFERRED EMBODIMENTS

Figure 1:
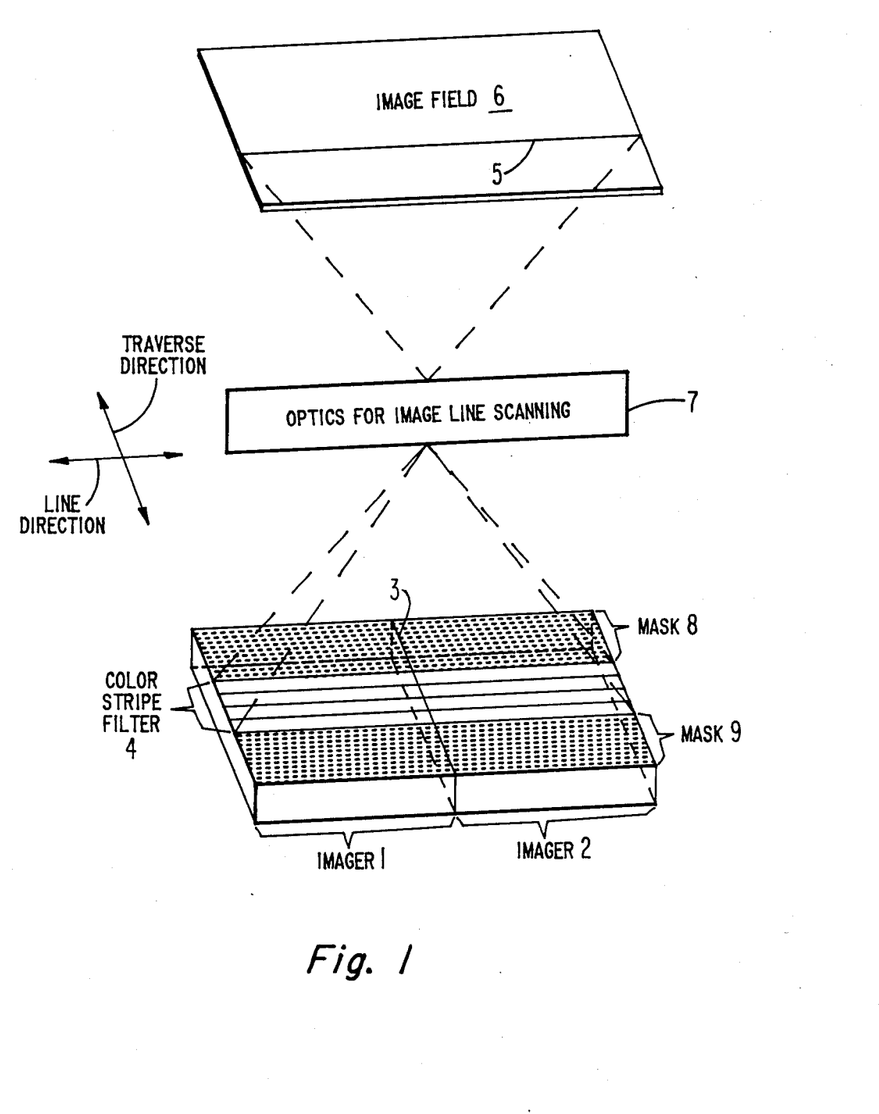
FIG. 1 is a schematic diagram of how edge-abutted CCD imagers of the sort embodying the invention are arranged to receive color-discriminated line images.

In FIG. 1 an imager 1 and an imager 2 are edge-abutted at an interface 3 running in a transverse direction respective to the line direction, in which line direction extend the line images supplied to photosensing sites on the imagers 1, 2. These photosensing sites (not specifically shown) are arranged in rows underlying the color-selective stripes of a contact type color-stripe filter 4. A strip 5 of an image field 6 is selected by optics 7 for line image scanning. Optics 7 projects a multiple line image through the respective stripes of color-stripe filter 4 to respective rows of photosensing sites on both imager 1 and imager 2, or projects a line image astigmatic in the transverse direction through all the stripes of color-stripe filter 4.

Color-stripe filter 4, shown as being a contact type disposed directly on surfaces of imager 1 and imager 2 aligned in a plane, alternatively may be located in the focal plane of relay optics between optics 7 and the imagers 1, 2. To avoid needing transparent gate electrodes, imagers 1 and 2 in our satellite camera were CCD imagers of the back-illuminated type. In these, radiant energy enters the CCD imager through the surface of the semiconductor die opposite its surface on which the gate electrodes of the charge transfer devices are disposed. Silicon semiconductor dies on which back-illuminated CCD imagers are constructed are thinned to facilitate the penetration of radiation, particularly at the blue end of the visible spectrum, and then are mounted on a glass plate transparent to the visible and near infrared (NIR) spectrum. Alternatively, front-illuminated CCD imagers can be used with the invention. With any of these variants the surfaces of imagers 1 and 2 upward in FIG. 1 are provided with masks 8, 9 (shown in stipple in FIG. 1). These masks are opaque to incident radiation, except for those portions of the imager surfaces through which line images selectively filtered by color-strip filter 4 are projected.

Optics 7 are for the most part conventional in design. They will include a spatial filter with slit aperture running in line direction and usually will make use of cylindric lens for increased light collection. Where the television camera does not translate respective to image field 6 in the transverse direction, as was the case with our satellite camera, optics 7 may include an oscillating mirror for scanning in the transverse direction. The most significant departure from conventional optics design for CCD line imagers is the inclusion of a beam splitter to provide for parallel component line images, or the inclusion of lens to introduce astigmatism in the transverse direction so the line image spreads out in that direction to cover parallel rows of photosensing sites.

Figure 2:
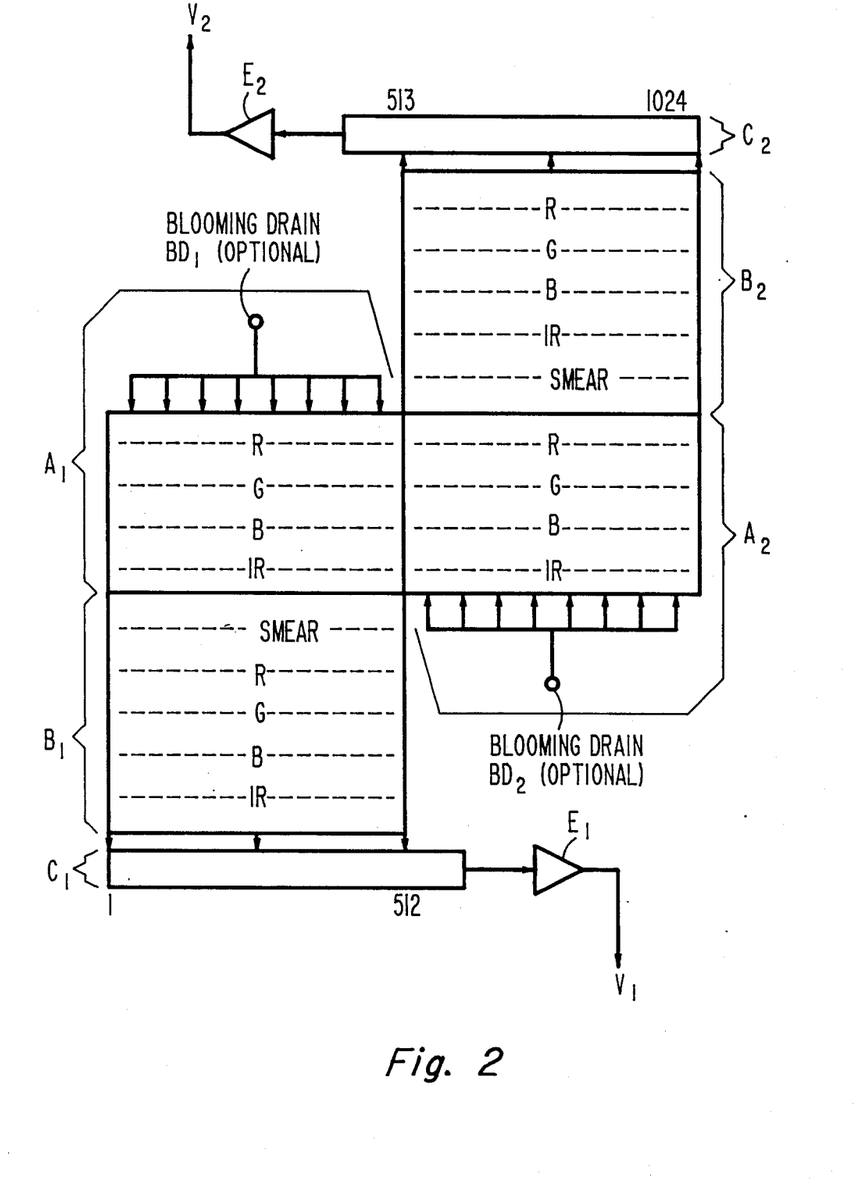
FIG. 2 is a diagram showing the general architecture of the VIS/NIR sensor which embodies our invention and is used as a component segment of the linear imager in the satellite camera.

FIG. 2 is a diagram (similar to one used in a NASA design review) of the architecture of the portion of the replicated line imager that appears on one monolithic die of our camera; this portion of the imager is referred to as the "VIS/NIR sensor" since it is used to sense both the visible and near infrared components of wide-spectrum light reflection from an illuminated object. Its image or A register is a composite register that stretches across the middle of FIG. 2, being composed of a component $A_1$ register on the left and a component $A_2$ register on the right.

The $A_1$ register and a following first transfer storage, or $B_1$, register each comprise $2^9$ parallelled charge transfer channels, or columns, those of the $B_1$ register being connected in cascade after respective ones of the $A_1$ register. The $2^9$ charge transfer channels of the $B_1$ register then connect to respective ones of the successive charge transfer stages in a first output line, or $C_1$, register. The $2^9$ parallelled charge transfer channels in the $A_1$ and $B_1$ registers and the $2^9$ serial charge transfer stages of the $C_1$ registers cannot be drawn on a normal size sheet, and the dimensioning in this direction is represented in abstract form by the initial and final ordinal numbers "1" and "512" of these structures at the bottom of FIG. 2.

The $A_2$ register and a following second storage, or $B_2$, register each comprise $2^9$ paralleled charge transfer channels, or columns, those of the $B_2$ register being connected in cascade after respective ones of the $A_2$ register. The $2^9$ charge transfer channels of the $B_2$ register then connect to respective ones of the successive charge transfer stages in a further output line, or $C_2$, register. The $2^9$ parallelled charge transfer channels in the $A^2$ and $B^2$ registers and the associated charge transfer stages in the $C_2$ register are ordinally numbered "513" through "1024," as indicated by these numbers appearing at the top of FIG. 2. $C_1$ and $C_2$ registers are shown each with a few further stages at their ends.

The columns of the $A_1$ and $A_2$ registers may have blooming drains between them. These blooming drains are the "teeth" of one of two "comb" structures $BD_1$ and $BD_2$, each drain being connected at one of its ends to one of two drain buses forming the "backs" of the "comb" structures $BD_1$ and $BD_2$, which buses have respective connections for accessing from off-die. The accessibility of the blooming drain structures $BD_1$ and $BD_2$ for off-die connection is a feature of the FIG. 2 imager architecture.

Dashed lines in the $A_1$ and $A_2$ registers indicate the locations of rows of charge storage stages in bands respectively associated with the red (R) stripe, the blue (B) stripe, the green (G) stripe and the near infrared (NIR) stripe of the color-stripe filter 4 of FIG. 1. In FIG. 2 each row indicated by dashed line is to be viewed as being associated with a respective charge transfer stage in each of the $2^{10}$ charge transfer channels of the $A_1$ and $A_2$ registers. That is, each of these charge transfer channels consists of four charge transfer stages in series; and, during image integration times when $A_1$ and $A_2$ register clocking is halted, these four charge transfer stages collect charge carriers generated respectively by photoresponse to R, G, B and NIR components of a line image segment.

During each replicated-line-image-transfer time interval, interspersed among image integration intervals, the clocking of the $A_1$ and $A_2$ component image registers is resumed. The ones of the successive charge transfer stages in each charge transfer channel (or column) of a CCD register which align in the direction orthogonal to the column are considered as forming a row in that register. The charge packets accumulated in the four rows of the $A_1$ register during an image integration time are transferred to corresponding rows of the $B_1$ register by clocking these $A_1$ and $B_1$ registers synchronously during the ensuing replicated-line-image transfer interval; and the charge packets accumulated in the four rows of the $A_2$ register are transferred to corresponding rows of the $B_2$ register by clocking these registers synchronously. The $B_1$ and $B_2$ registers are provided with more rows than the $A_1$ and $A_2$ registers, and the synchronous clocking of these registers is continued after charge packets descriptive of line image have been clocked out of the $A_1$ and $A_2$ registers into the $B_1$ and $B_2$ registers, respectively. This transfers a row of smear charge samples into each of the $B_1$ and $B_2$ registers behind their respective rows of IR, B, G and R samples. The CCD replicated line imager is like the field transfer type of CCD area imager in that: when operated open-shutter during transfer from image register, or when operated shutterless, the imager is subject to transfer smear. The generation of transfer smear has been described in detail by P. A. Levine in his U.S. Pat. No. 4,010,319 issued Mar. 1, 1977 and entitled "SMEAR REDUCTION IN CCD IMAGERS". The collection of smear charge samples by empty-well clocking, as is done in the NASA satellite camera herein described, is described in detail in P. A. Levine's U.S. patent application Ser. No. 554,085 filed Nov. 21, 1983, now U.S. Pat. No. 4,567,524, entitled "SMEAR REDUCTION IN CCD IMAGERS USING EMPTY WELL CLOCKING", and assigned to RCA Corporation.

In the ensuing image integration time, when $A_1$ and $A_2$ register clocking is again halted, $B_1$ and $B_2$ register forward clocking continues intermittently to advance lines of charge packets in parallel from one row to the next in each of the $B_1$ and $B_2$ registers. The lines of charge packets advanced out of the $B_1$ and $B_2$ registers are parallelly loaded respectively into the charge transfer stages of the $C_1$ register and into the charge transfer stages of the $C_2$ register, while $C_1$ and $C_2$ clocking is halted. $B_1$ and $B_2$ register clocking is at relatively low rate and after each line advance, with the stages of the $C_1$ and $C_2$ registers having been parallelly loaded with charge packets, the $C_1$ and $C_2$ registers are clocked at relatively high rate to transfer these charge packets in shift register operation. This operation supplies charge packets from registers $C_1$ and $C_2$ serially to an electrometer stage $E_1$ and to an electrometer stage $E_2$, respectively. Electrometer stages $E_1$ and $E_2$ are floating-diffusion output stages in the NASA satellite camera.

Figure 3:
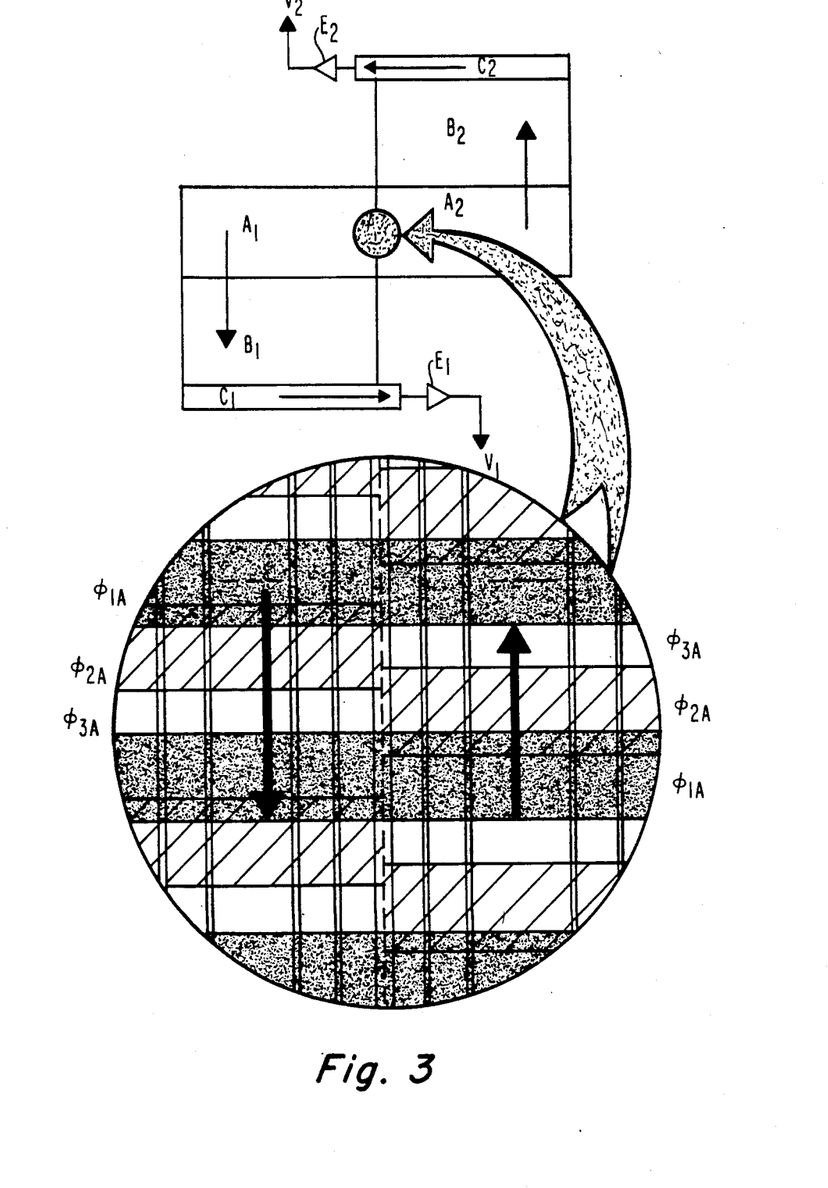
FIG. 3 is a diagram showing in circular inset a detail of the FIG. 2 architecture.

FIG. 3 is a diagram (similar to one used in NASA design review), which shows at top a stylized representation of the FIG. 2 architecture with a circular area at the adjoining edges of the $A_1$ and $A_2$ registers being indicated by stippling, and which shows in circular inset at bottom an expanded detail view of gate electrode structure in the indicated circular area. FIG. 3 is useful in understanding how the $A_1$ and $A_2$ registers are clocked for charge transfer in opposing directions. Each of the first-layer polysilicon gate electrodes $\phi_{1A}$, shown in heavy stipple and receptive of a first phase $\Phi_{1A}$ of three-phase A register clocking signal, extend straight across both $A_1$ and $A_2$ component registers of the complete A register. The second-layer polysilicon gate electrodes $\phi_{2A}$, shown in crosshatch and receptive of a second phase $\Phi_{2A}$ of three-phase A register clocking signal, overlap the bottom edges of the first-layer polysilicon gate electrodes in the $A_1$ register shown at the left of the FIG. 3 blown-up inset; but they overlap the top edges of the first-layer polysilicon gate electrodes in the $A_2$ register shown at the right of the FIG. 3 blown-up inset. A third-layer of polysilicon is a sheet electrode $\phi_{3A}$ which extends over the entire gate electrode structure thusfar described and receives a third phase $\Phi_{3A}$ of three-phase A register clocking signal. So, during image transfer times three-phase A register clocking signals are in progressive succession $\Phi_{A1}$, $\Phi_{A2}$, $\Phi_{A3}$ to transfer charge packets in the forwarded direction from top to bottom in the $A_1$ register and from bottom to top in the $A_2$ register. During image integration times the buried CCD in n-type silicon bulk has its second- and third-layer polysilicon gate electrodes held relatively negative and has its first-layer polysilicon gate electrodes held relatively positive. Consequently, charge carriers generated by photoconversion are collected under the first-layer polysilicon gate electrodes.

Figure 4:
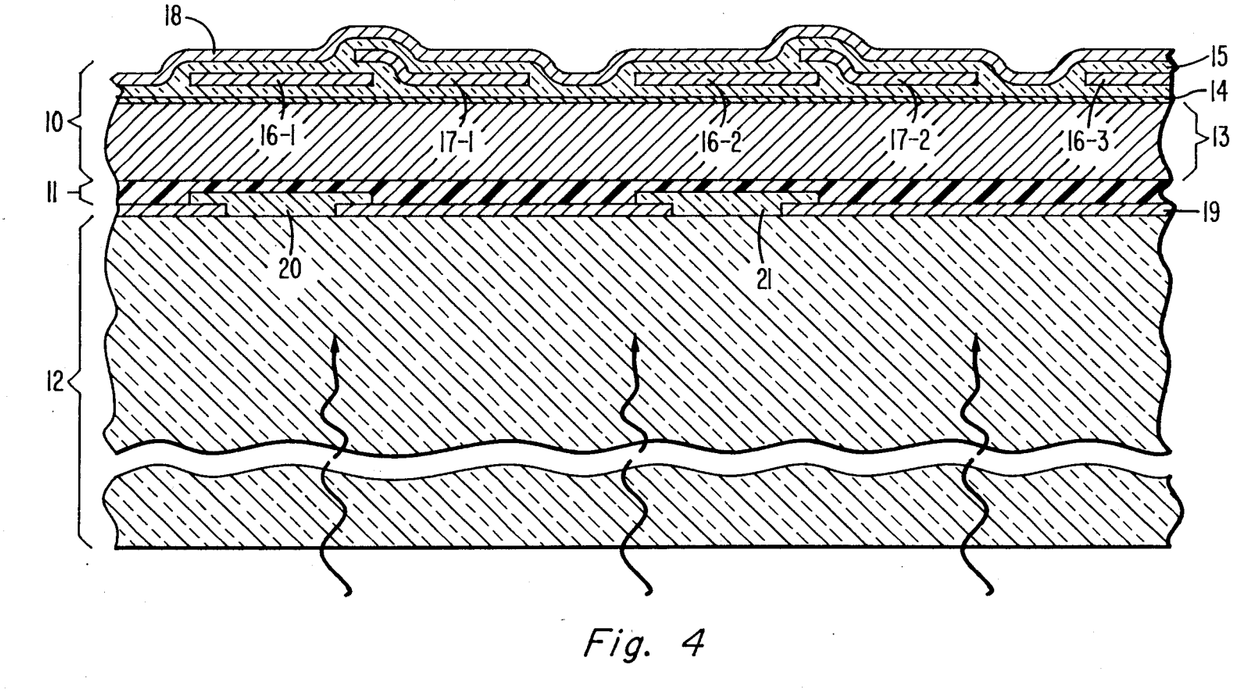
FIG. 4 is a cross-sectional view of the VIS/NIR sensor image register.

FIG. 4 is a cross-section of the laminated CCD imager and color-stripe filter assembly, in the image register region. The cross-section is taken transverse to the gate electrode structure. The thinned CCD imager 10 per se is connected by a layer 11 of epoxy to a relatively thick glass support plate 12 shown in broken-view. CCD imager 10 is formed in a silicon substrate 13 of p-type silicon; and the CCD structures are made to be of buried type, for which purpose a thin region 14 of n-type silicon overlies substrate 13. (The bottom surface of the p-type silicon substrate 13 is made p+ to provide a drift field into the substrate to avoid back surface recombination noise; this detail is not shown in FIG. 4.) A three polysilicon layer gate electrode structure overlies region 14. A passivated silicon dioxide structure 15 extending over the surface of region 14 has disposed therein a succession of storage gate electrodes 16-1, 16-2, 16-3 located in the first polysilicon layer and overlapped at their trailing edges by the leading edges of respective one of transfer gate electrodes 17-1, 17-2 located in the second polysilicon layer. The third layer 18 of polysilicon forms a sheet electrode providing transfer gates between each transfer gate electrode 17-1, 17-2 in the second polysilicon layer and the succeeding storage gate electrode 16-2, 16-3 in the first polysilicon layer. The effective length of the storage gates is 25 $\mu$m; the effective lengths of the transfer gates following them are 20 $\mu$m and 15 $\mu$m; and the silicon substrate 13 is thinned to 12 $\mu$m thickness. The methods for thinning substrate 13 and for making the gate structure are well-known in the art.

The storage gate electrodes 16-1, 16-2, 16-3 in the first layer of polysilicon have $\Phi_{1A}$ clocking voltage applied to them; the transfer gate electrodes 17-1, 17-2 in the second layer of polysilicon have $\Phi_{A2}$ clocking voltage applied to them; and the transfer gate "electrodes" provided by the sheet electrode 18 in the third layer of polysilicon have $\Phi_{3A}$ clocking voltage applied thereto. Integration of charge carriers generated by photoconversion is done in substrate 13 in potential wells induced under the storage gates 16-1, 16-2, 16-3 in the first layer of polysilicon. Light, as indicated by wavy arrows, enters silicon substrate 13 from the "back" surface (i. e. the bottom surface as shown in FIG. 4 and as considered by a semiconductor die designer), coming through slits (shown in cross section) in a metal mask 19 evaporated on the surface of glass support plate 12 cemented to substrate 13. These slits are centered under the storage gate electrodes 16-1, 16-2, 16-3 providing a 15 $\mu$m aperture. Color-selective stripe filters (e.g. 20, 21) are laid down over these slits and epoxy flows around these filters in forming the otherwise-three-micrometer thick layer 11 when substrate 13 is cemented to glass support plate 12. Support plate 12 is transparent to visible light and near-IR which enters at the surface appearing at the bottom of FIG. 4, which surface is provided per convention with an anti-reflective coating (not shown in FIG. 4).

Figure 5:
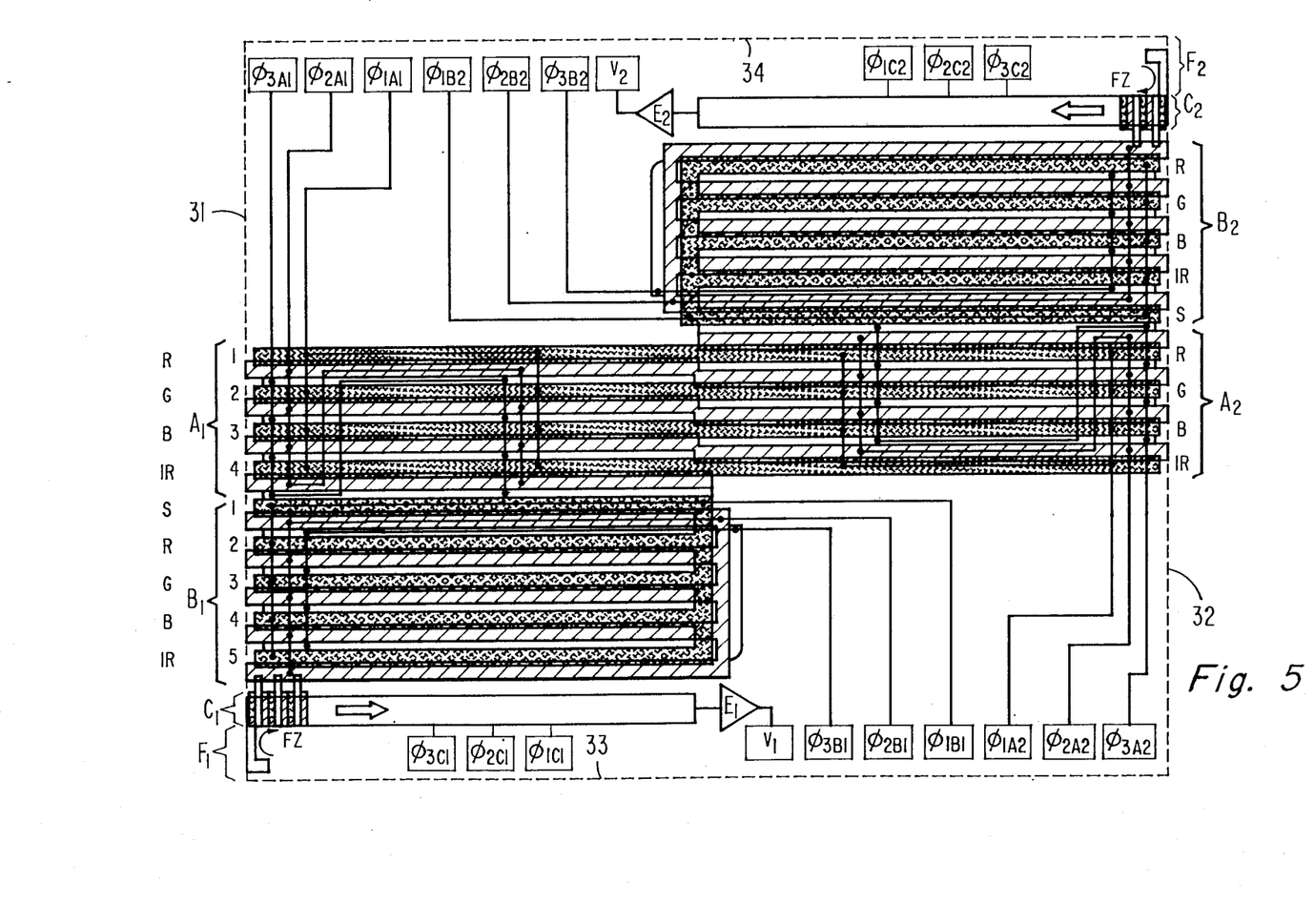
FIG. 5 is a simplified plan view of the VIS/NIR sensor, shown with reduced length in the left/right direction for ease of illustration.

FIG. 5 shows the front surface of a back-illuminated CCD imager viewed through the thinned semiconductor die and opposite back surface. Three-phase clocking is used in the FIG. 5 imager, which is of the type CCD imagers 1 and 2 of FIG. 1 are in our satellite camera. The first and second layers of polysilicon gate electrodes are shown in stipple and in cross-hatch, respectively. The third layer of polysilicon electrodes comprises area electrodes each covering a complete CCD register, and the visible portions of these area electrodes are shown without stipple or cross-hatch.

The composite image register comprises component image registers respectively denominated $A_1$ and $A_2$. The gate electrodes in first layer of polysilicon are continuous across both the $A_1$ and $A_2$ registers, and during image integration times the collection of charge carriers generated by photoconversion takes place in the potential energy wells induced by relatively positive voltages in these gate electrodes. The gate electrodes in the second layer of polysilicon jog in position at the juncture between $A_1$ and $A_2$ registers, in effect changing the order in these registers of these second-layer gate electrodes with the portions of the area electrode in the third layer of polysilicon not electrostatically shielded against by the second-layer gate electrodes. This arranges the $A_1$ and $A_2$ registers for charge transfer in opposing directions during field transfer times when normal three-phase clocking resumes, (rather than clocking being halted as during image integration, with the first-layer gate electrodes being maintained relatively positive and the second-layer and third-layer gate electrodes being maintained relatively negative).

There are four first-layer gate electrodes and $2^9$ columns in each of the $A_1$ and $A_2$ component image registers. So there are four rows of $2^{10}$ photosensing sites in the composite image register. The large number of photosensing sites per row makes it impractical to show separately each column of the $A_1$ and $B_1$ registers and of the $A_2$ and $B_2$ registers, or to show each charge transfer stage of the $C_1$ and $C_2$ registers arranged to be side-loaded respectively from the $B_1$ and $B_2$ registers. So, there is considerable foreshortening in FIG. 5 of the extent of the VIS/NIR sensor from left to right. The further charge transfer stages in the $C_1$ register, not explicitly shown, are implicitly indicated by the arrow specifying charge transfer in the righthand direction during serial read-out to electrometer stage $E_1$; and, similarly, the further charge transfer stages in the $C_2$ register, by the arrow specifying charge transfer in the lefthand direction during serial read-out of register $C_2$ to output electrometer stage $E_2$.

During field transfer intervals the $A_1$ image register transfers charge packets through the charge transfer channels forming its respective columns into charge transfer channels forming the columns of a transfer storage $B_1$ register. And the $A_2$ image register transfers charge packets through the charge transfer channels forming its respective columns into charge transfer channels forming the columns of a transfer storage $B_2$ register. There is synchronous three-phase clocking of the $A_1$ and $B_1$ registers and of the $A_2$ and $B_2$ registers during field transfer intervals, and this synchronous clocking continues for one row advance after the rows of the $A_1$ and $A_2$ registers are cleared of charge packets descriptive of picture element samples. The $B_1$ and $B_2$ registers have five rows apiece; and at the conclusion of field transfer a row of transfer smear response samples in each of these registers together with a row of R response samples, a row of G response samples, a row of B response samples and a row of NIR response samples. The generation of transfer smear samples by clocking a phantom row of charge samples across an image register, and the ways in which such transfer smear samples are used to improve CCD imager output signals are explained in detail by P. A. Levine in his U.S. Pat. No. 4,567,524.

During each image integration interval subsequent to a respective field, transfer clocking is halted in the $A_1$ and $A_2$ registers with $\Phi_{2A}$ and $\Phi_{3A}$ phases which are held low, or relatively negative in potential. Charge carriers generated by photoconversion in the silicon substrate called under the gate electrode which is receptive of $\Phi_{1A}$ phase held high and is nearest to the site of their generation. The lines of charge packets transferred to the $B_1$ and $B_2$ registers are clocked to advance lines of charge packets in ranks from one row to the next at selected times within the image integration interval, with the last lines transferred out of the $B_1$ and $B_2$ registers side-loaded in parallel into the charge transfer stages of the $C_1$ and $C_2$ registers, respectively. During this side-loading process clocking is halted in the $C_1$ and $C_2$ registers to condition their respective charge transfer stages to accept charge packets transferred from respective columns of the $B_1$ and $B_2$ registers. After the $C_1$ and $C_2$ registers are side-loaded in parallel with lines of charge packets, $C_1$ is clocked to transfer the charge packets therein serially to electrometer output stage E; and $C_2$ is clocked to transfer the charge packets therein serially to electrometer output stage $E_2$. Best modulation transfer factor (MTF) is obtained at lower $C_1$ and $C_2$ clocking rates, so it is advantageous to forward clock $C_1$ and $C_2$ registers in parallel using spatial division multiplexing of the $E_1$ and $E_2$ outputs. But one of the $C_1$ and $C_2$ registers may be forward clocked to transfer all image samples out of it, then the other one forward clocked to transfer all image samples out of it, in a time division multiplexing alternative mode of operation.

One skilled in the art of CCD imager design will notice the similarities of the charge transfer operations in th replicated line imager to the charge transfer operations in area imagers of field transfer type. FIG. 5 is of primary interest in discussing in more detail the layout advantage of the replicated line imager architecture shown in more abstract form in FIG. 2, particularly with regard to the solution of the problems with the routing of clocking voltage buses.

The first and second straight-line edge boundaries 31, 32 of the monolithic die top surface which may abut corresponding second and first boundaries of the top surfaces of adjoining similar monolithic dies are related to the FIG. 5 plan view as follows. The left ends of the $A_1$ and $B_1$ registers and the left end of the $C_1$ register align along the first straight-line edge boundary 31 of the monolithic die top surface. The right ends of the $A_2$ and $B_2$ registers and the right end of the $C_2$ register align along the second straight-line edge boundary 32 of the monolithic die top surface.

The more important bond pads for connection of the CCD imager die to its package pin-out are shown in FIG. 5 as little boxes, each surrounding the designation of the signal to flow there through which may also be considered as "identification numeral" for the bond pad. The bond pads for the imager are on the top surface of the die along third and fourth boundaries 33, 34 of the surface respectively at bottom and top of FIG. 5 and both perpendicular to the first and second boundaries of the surface; this is done to facilitate the abutting of monolithic dies to obtain the lengthened replicated line imager. The output connections of the electrometer output stages $E_1$ and $E_2$ are actually closer to the center of the monolithic die than appears in FIG. 5, which is illustrated with reduced length in the left/right direction. These connections are to bond pads located centrally along the third and fourth boundaries, 33, 34 respectively, of the imager front-side surface. Clockwise (as viewed from the backside of the imager per FIG. 5) along the third boundary 33 from the $V_1$ bond pad to which $E_1$ output connection is made are positioned $\Phi_{1C1}$, $\Phi_{2C1}$, $\Phi_{3C1}$ bond pads to which buses for the clocking voltages of $C_1$ register connect; and clockwise along the fourth boundary 34 from the $V_2$ bond pad to which $E_2$ output connection is made are positione $\phi_{1C2}$, $\phi_{2C2}$, $\phi_{3C2}$ bond pads to which buses for the clocking voltages of the $C_2$ register connect.

The $C_1$ and $C_2$ registers have "fat zero" (FZ) bias charges sideloaded into charge transfer stages at their left and right ends, respectively, by charge injection circuitry $F_1$ and $F_2$, respectively, at the bottom and at the top of FIG. 5 near the third and fourth boundaries of the front surface of the imager. These fat zero charges are clocked through the $C_1$ and $C_2$ registers to occupy their charge transfer stages as they are emptied of charge packets descriptive of image samples. Bond pads for application of voltages to control "fat zero" level, if used, would be located in a far left position along the third boundary 33 and in a far right position along the fourth boundary 34.

The $\phi_{1B1}$ and $\phi_{2B1}$ and gate electrodes of register $B_1$ and the $\phi_{1B2}$ and $\phi_{2B2}$ electrodes of register $B_2$ are the "teeth" of four "comb" structures having their backs near die center. The backs of the comb structures providing $\phi_{1B1}$ and $\phi_{2B1}$ gate electrodes and the sheet electrode providing $\phi_{3B1}$ gate electrodes are ohmically contacted at their right edges by metal buses connecting to $\phi_{3B1}$, $\phi_{2B1}$, $\phi_{1B1}$ bond pads located counter-clockwise (as viewed from the side of the imager shown in FIG. 5) from the electrometer output stage $E_1$ output bond pad $V_1$. The backs of the comb structures providing $\phi_{1B2}$ and $\phi_{2B2}$ gate electrodes and the sheet electrode providing $\phi_{3B2}$ gate electrodes are ohmically contacted at their left edges by metal buses connecting to $\phi_{3B2}$, $\phi_{2B2}$, $\phi_{1B2}$ bond pads located counter-clockwise (as viewed from the side of the imager shown in FIG. 5) from the electrometer output stage $E_2$ output bond pad $V_2$.

Note the clocking voltage buses to the $C_1$ and $C_2$ registers do not run over any clocking voltage buses of the other registers. Nor do the clocking voltage buses to the $B_1$ and $B_2$ registers run over the clocking voltage buses to the $A_1$ or $A_2$ registers. So, the likelihood of the magnitudes of charge packets in the CCD registers being perturbed by clock noise is substantially de minimus.

The gate electrode structures in register $A_1$ receptive of the $\Phi_{3A1}$, $\Phi_{2A1}$ and $\Phi_{1A1}$ clocking signals ohomically contacted by metal buses connecting to $\phi_{3A1}$, $\phi_{2A1}$, $\phi_{1A1}$ bond pads located in the leftmost positions along the top boundary 34 of the imager front-side surface. The gate electrode structures in register $A_2$ receptive of $\Phi_{1A2}$, $\Phi_{2A2}$, and $\Phi_{3A2}$ clocking signals are ohmically contacted by metal buses connecting to $\phi_{1A2}$, $\phi_{2A2}$, $\phi_{3A2}$ bond pads located in the rightmost positions along the bottom boundary 33 of the imager front-side surface.

Bond pads for drain voltages and substrate drain voltages (not shown) are suitably interspersed between sets of the bond pads thusfar described. The foregoing description should make clear that the FIG. 2 architecture for the replicated line imager provides straightforward accessibility of the various areas of the chip for metal bus connection to bond pads along the top and bottom edges of the dies without need for cross-unders or tunnels.

In the color-discriminating replicated line imager used in the satellite camera, the maintenance of color purity in the lines of charge packets responsive to different filterings of light energy is a primary concern, and transfer smear degrades color purity. To reduce transfer smear insofar as possible, the transfers of charge packets from $A_1$ to $B_1$ register and from $A_2$ to $B_2$ register are made as fast as possible. The fast clocking thus necessitated and the extreme width of the gate electrodes in the $A_1$, $B_1$, $A_2$ and $B_2$ registers makes low-pass filtering of clocking voltages, as imposed by the distributed resistances of the polysilicon gate electrodes and their distributed capacitances, a considerable problem. The connection through from $A_1$ register to $A_2$ register of similarly clocked polysilicon gate electrodes, together with the imposition of clocking voltages at both ends of the composite A register thus provided, helps reduce this problem in the center of the composite A register by parallelling two distributed resistances back from the distributed capacitance to clock voltage drive sources.

This problem is further reduced by exploiting the per-unit-length resistivity of top aluminization busses being lower than that of polysilicon gate electrodes. The A register gate electrodes of like phasing have interconnection by top aluminization not only at their ends, but at two locations along their lengths. These interconnections are then parallelled by top aluminization bus connections superposed over certain of the gate electrodes clocked by the very clocking voltages the bus connections carry. This further reduces the effective distributed resistances of the $\phi_{1A1}$, $\phi_{2A1}$, $\phi_{3A1}$, $\phi_{1A2}$, $\phi_{2A2}$, and $\phi_{3A2}$ gate electrodes at most points along their lengths to permit faster A register clocking during image transfer intervals. For similar reasons the $B_1$ and $B_2$ registers have interconnections of like-phase gate electrodes at their ends and midway along their lengths, to which clocking voltages are applied by top aluminization bus connections superposed over certain of the gate electrodes clocked by the very clocking voltages the bus connections carry. The running of the clocking voltage top aluminization bus connections over polysilicon gate electrodes, to which are applied the voltages the bus connections carry, avoids undesirable clocking voltage cross-talk to the gate electrodes.

As the technology of making imperfection-free momolithic semiconductor devices improves, so longer die sizes become more practical, more complex CCD imager architectures which utilize the teachings of our invention may become attractive to use. The image sensing sites in these CCD line imagers may be apportioned into 2N image registers, where N is a positive integer larger than one, with a corresponding number of transfer storage registers disposed on alternate sides of the composite image register, with a corresponding number of output registers for performing parallel-to-series conversion, and with electrometer stages disposed away from the edges of the die for sensing the charge packets serially supplied from the output registers. In other words architectures where a plurality N of architectures per FIGS. 2 and 5 are disposed side by side on a single monolithic semiconductor die, with image register rows in alignment, are possible. The apportionment of image sensing sites among 2N component image registers will still be desirable for avoiding the problem of transfer efficiency introducing line shading in a very long line imager. There is additional flexibility in these extended architectures with regard to the positioning of the electrometer output stages with respect to the ends of output line (C) registers not at the edges of the die; the electrometer stages can be at either end of one of these output line (C) registers. Furthermore, certain of these architectures with 2N image registers, N being greater than one, can be modified to archtectures with 2N−1 image registers by lopping off one of the end component image (A) registers and its associated transfer storage (B) and output line (C) registers.

Our teaching with regard to dividing a line imager image register to supply ranks of charge packets to a plurality of output registers alternatively placed on opposite sides of the image register is applicable to certain simpler CCD imager architectures. A line imager with a single row image register and no transfer storage register may, for example, use two or more output registers alternately placed on opposite sides of the image register.

Such a line imager with two output registers is configured on a monolithic die so as to be abuttable with other line imagers to form an extended line imager, in an alternative satellite camera to the embodiment just described. Four extended line imagers are used, the image register of each irradiated with a line image of a different one of the R, G, B and NIR spectral components. In this alternative satellite camera, which is more complex than the camera we have described in detail, the problem of transfer smear is avoided in the imagers themselves.

The scope of the claims which follow should be construed taking into consideration such alternative embodiments of our invention.

What is claimed is:
1. A television camera comprising:
a semiconductor imager having an image area register in which photosensing sites are arranged by row and by column, having a charge coupled device storage area register for periodically receiving successive rows of charge samples from said photosensing sites one row after another having an output register for receiving the charge samples of each successive row in parallel from said storage register and providing them in serial order, and having charge sensing circuitry coupled to said output register for converting each said successive row of charge samples provided in said serial order into a respective line of an output signal;

means for acquiring radiation defining a line image;

an optical filter system having spectrum-discriminating stripe filters; and means for projecting said line image through each stripe filter of said optical filter system at the same time, such that at least a segment of said line image which passes through each stripe filter is projected into said image register so as to impinge on a respective row of said image register, each respective row photosensing paid projected segment of said line image simultaneously.

2. A television camera as set forth in claim 1 wherein said means for acquiring radiation defining a line image is of a type for acquiring a plurality of line images, successive in time, and includes:

means for causing successive ones of said line images to scan over a field of view in a direction transverse to the direction in which said line images extend.

3. A television camera as set forth in claim 2 having at least a further one of said semiconductor imager, the rows in the image register of each semiconductor imager being impinged upon by a different segment of said projected line image.

4. A television camera as set forth in claim 1 having at least a further one of said semiconductor imager, the rows in the image register of each semiconductor imager being impinged upon by a different segment of said projected line image.

5. A television camera as set forth in claim 1 wherein said means for acquiring radiation defining a line image includes a beam splitter for splitting an original line image for projection through respective stripes of said striped optical filter.

6. A television camera as set forth in claim 1 wherein said means for acquiring radiation defining a line image includes means for defocussing an original line image in the direction transverse to the direction in which the rows of photosensing sites in said semiconductor imager extend, said defocussed original line image being projected through the stripes of said striped optical filter.

7. A monolithic CCD imager for generating an imager output signal, comprising:

at least one row of photosensing sites extending in a direction, each said row having its length impinged upon by at least a segment of a respective line image;

first and second CCD output registers, each comprising a respective succession of charge transfer stages arranged in a respective charge transfer channel extending parallel to said direction;

means for periodically transferring charge samples from each said row of photosensing sites, for loading charge samples in parallel from along a first segment of said row into the charge transfer stages of said first CCD output register, and for loading charge samples in parallel from along a second segment of said row into the charge transfer stages of said second CCD output register;

means, operative between periods for transferring charge samples from said photosensing sites and for loading charge samples in parallel into the charge transfer stages of said first CCD output register, for transferring the parallely loaded charge samples from each successive charge transfer stage in said first CCD output register to the next in a direction towards the center of the imager;

means, operative between periods for transferring charge samples from said photosensing sites and for loading charge samples in parallel into the charge transfer stages of said second CCD output register, for transferring the parallely loaded charge samples from each successive charge transfer stage in said second CCD output register to the next in a direction towards the center of the imager;

means for sensing charge samples transferred from the last charge transfer stage of said first CCD output register for generating samples of said imager output signal; and means for sensing charge samples transferred from the last charge transfer stage of said second CCD output register for generating samples of said imager output signal.

8. A monolithic CCD imager as set forth in claim 7 wherein said first and second CCD output registers are on opposite sides of said at least one row of photosensing sites.

9. A plurality of monolithic CCD imagers as set forth in claim 8 abutted end-to-end with their rows of photosensing sites in alignment, thereby to provide a composite, extended imager.

10. A monolithic CCD imager as set forth in claim 8 wherein there are plural rows of photosensing sites receptive of respective line images, said sites being arranged in columns corresponding to parallelled charge transfer channels of first and second CCD image registers, the portions of said rows of photosensing sites in said first CCD image register originating charge samples respectively descriptive of first segments of said respective line images impinging on those portions of said rows, and the portions of said rows of photosensing sites in said second CCD image register originating charge samples respectively descriptive of said segments of said respective line images impinging on those portions of said rows; and wherein said means for periodically transferring charge samples includes a first CCD charge transfer storage register with parallelled charge transfer channels connecting between respective parallelled charge transfer channels of said first CCD image register and respective charge transfer stages of said first CCD output register, and includes a second CCD charge transfer storage register with parallelled charge transfer channels connecting between respective parallelled charge transfer channels of said second CCD image register and respective charge transfer stages of said second CCD output register.

11. A plurality of monolithic CCD imagers as set forth in claim 10 abutted end-to-end with their rows of photosensing sites in alignment, thereby to provide a composite, extended imager.

12. A plurality of monolithic CCD imagers, as set forth in claim 11, in combination with:

means for acquiring radiation defining a plurality of straight line images, successive in time, including means for causing successive ones of said line images to scan over a field of view in a direction transverse to the direction in which the line images extend;

an optical filter including color-discriminating stripes; and means for projecting respective portions of one of said successive line images at a time through said stripes of said optical filter and into the photosensing sites in respective ones of said plurality of monolithic CCD imagers so that each of said projected portions of said one line image impinges on a respective set of aligned rows of photosensing sites in a respective one of said pluarlity of monolithic CCD imagers.

13. A plurality of monolithic CCD imagers, as set forth in claim 11, in combination with
    means for acquiring radiation defining a plurality of straight line images, successive in time, including means for causing successive ones of said line images to scan over a field of view in a direction transverse to the direction in which the line images extend; and
    means for projecting different portions of the spectral content of each said successive straight line image into respective aligned rows of photosensing sites in said monolithic CCD imagers.

14. A monolithic CCD imager as set forth in claim 10, in combination with:
    means for acquiring radiation defining a plurality of straight line images, successive in time, including means for causing successive ones of said line images to scan over a field of view in a direction transverse to the direction in which the line images extend; and
    means for projecting different portions of the spectral content of each said successive straight line image into respective rows of photosensing sites in said monolithic CCD imager.

15. A monolithic CCD imager as set forth in claim 10, in combination with:
    means for acquiring radiation defining a plurality of straight line images, successive in time, including means for causing successive ones of said line images to scan over a field of view in a direction transverse to the direction in which the line images extend;
    an optical filter including color-discriminating stripes; and
    means for projecting respective portions of one of said successive straight line images at a time through said stripes of said optical filter and into the photosensing sites of respective image registers of said monolithic CCD imager, so that each of said projected portions of said one line image impinges on said rows of photosensing sites in one of said respective image registers of said monolithic CCD imager.

16. A method of operating, as a replicated line imager, a semiconductor imager of a type having an image register in which photosensing sites are arranged by row and by column, there being a plurality of rows of photosensing sites and a plurality of columns of photosensing sites, said method comprising the steps of:
    generating optically a plurality of parallel line images which are alike;
    optically processing said alike line images differently;
    projecting said differently processed line images into respective rows of the photosensing sites of said semiconductor imager;
    generating, through photosensing, charge packets at said photosensing sites, which charge packets are descriptive of line image samples;
    then, periodically removing charge packets from said photosensing sites row by row, serially, and then column by column serially in each row so as to regularly provide said rows of removed charge packets in serial order; and
    sensing the magnitudes of the charge packets to provide signals descriptive of said line images as subjected to each different optical processing.

17. A television camera comprising:
    a semiconductor imager having an image area register in which photosensing sites are arranged by row and by column, having a storage area register for periodically receiving successive rows of charge samples from said photosensing sites one row after another, having an output register for receiving the charge samples of each successive row in parallel and providing them in serial order, and having charge sensing circuitry coupled to said output register for converting each successive row of charge samples provided in said serial order into a respective line of an output signal; and
    means for separating a relatively-wideband-spectrum optical line image into a number of parallelly disposed relatively-narrowband-spectrum optical line images for projection into said image register so each relatively-narrowband-spectrum optical line image impinges on a respective row of photosensing sites in said image register to be photosensed.

18. A television camera as set forth in claim 17 wherein said means for separating a relatively-wideband-spectrum optical line image into a number of parallelly disposed relatively-narrowband-spectrum optical line images includes a spectrum-discriminating striped color filter, having its color stripes over respective rows of photosensing sites in said image register.

* * * * *